(12) United States Patent
Mishima et al.

(10) Patent No.: US 9,374,866 B2
(45) Date of Patent: Jun. 21, 2016

(54) ORGANIC EL ILLUMINATION MODULE AND ILLUMINATION APPARATUS INCLUDING SAME

(71) Applicant: Panasonic Corporation, Osaka (JP)

(72) Inventors: Masanori Mishima, Kyoto (JP); Hirofumi Konishi, Osaka (JP); Masanao Okawa, Nara (JP); Yohei Hayashi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 688 days.

(21) Appl. No.: 13/681,519

(22) Filed: Nov. 20, 2012

(65) Prior Publication Data

US 2013/0127339 A1    May 23, 2013

(30) Foreign Application Priority Data

Nov. 21, 2011  (JP) ................................. 2011-254418

(51) Int. Cl.
| | | |
|---|---|---|
| *H01J 23/16* | (2006.01) | |
| *H05B 33/08* | (2006.01) | |
| *H01L 51/52* | (2006.01) | |
| *H01L 27/32* | (2006.01) | |

(52) U.S. Cl.
CPC ........ *H05B 33/0896* (2013.01); *H01L 27/3225* (2013.01); *H01L 51/5203* (2013.01); *H01L 51/5237* (2013.01)

(58) Field of Classification Search
CPC ........... F21K 9/00; H01L 5/54; H05B 33/0896
See application file for complete search history.

(56) References Cited

U.S. PATENT DOCUMENTS

| | | | |
|---|---|---|---|
| 2004/0124768 A1 | 7/2004 | Suzuki et al. | |
| 2004/0212299 A1 | 10/2004 | Ishikawa et al. | |
| 2006/0244702 A1* | 11/2006 | Yamazaki et al. | 345/89 |
| 2009/0302731 A1* | 12/2009 | Takamura | 313/46 |
| 2010/0026950 A1* | 2/2010 | Furuta et al. | 349/139 |
| 2011/0133660 A1 | 6/2011 | Tomita et al. | |
| 2011/0221979 A1 | 9/2011 | Takata | |

FOREIGN PATENT DOCUMENTS

| | | |
|---|---|---|
| CN | 101365906 | 2/2009 |
| CN | 102090149 | 6/2011 |
| JP | 2003-178876 | 6/2003 |

(Continued)

OTHER PUBLICATIONS

Japanese Office Action dated May 19, 2015 issued in a corresponding Japanese Patent Application No. 2011-254418 and English summary thereof.

(Continued)

*Primary Examiner* — Douglas W Owens
*Assistant Examiner* — Monica King
(74) *Attorney, Agent, or Firm* — Renner, Otto, Boisselle & Sklar, LLP (57) ABSTRACT

An organic EL module includes a flat plate-like light emitting panel configured to use an organic EL element; and a holding member configured to hold the light emitting panel. The holding member includes: a conductive member serving as at least a part of the holding member, and a capacitance component is provided between the conductive member and an electrode layer, the electrode layer being provided in the light emitting panel to supply a driving voltage thereto.

5 Claims, 8 Drawing Sheets

LIGHT EMITTING SURFACE SIDE

(56) References Cited

FOREIGN PATENT DOCUMENTS

| | | |
|---|---|---|
| JP | 2003-272859 | 9/2003 |
| JP | 2004-200041 | 7/2004 |
| JP | 2004-265758 | 9/2004 |
| JP | 2007-227523 | 9/2007 |
| JP | 2008-130438 | 6/2008 |
| JP | 2009-071158 | 4/2009 |
| JP | 2009-76266 | 4/2009 |
| JP | 2009-080989 | 4/2009 |
| JP | 2010-080844 | 4/2010 |
| WO | 2011/142254 | 11/2011 |

OTHER PUBLICATIONS

Chinese Office Action dated Oct. 10, 2015 issued in corresponding Chinese Patent Application No. 201210477615.4 and English translation thereof.

Chinese Office Action dated Jan. 28, 2015 issued in a corresponding Chinese application No. 201210477615.4 and English translation thereof.

* cited by examiner

FIG.1

LIGHT EMITTING SURFACE SIDE

FIG.2

LIGHT EMITTING SURFACE SIDE

FIG.3

LIGHT EMITTING SURFACE SIDE

FIG.4

LIGHT EMITTING SURFACE SIDE

ORGANIC EL ILLUMINATION MODULE AND ILLUMINATION APPARATUS INCLUDING SAME

FIELD OF THE INVENTION

The present invention relates to an organic EL illumination module and illumination apparatus including same.

BACKGROUND OF THE INVENTION

An organic EL element has recently been attracting wide attention as the light source of an illumination apparatus because the organic EL element emits high-brightness lights using low voltage in various colors depending on the kinds of organic compounds contained therein. Secondly, it is easy to manufacture a flat plate light emitting panel by using the organic EL element.

An illumination apparatus includes a light emitting panel in which a transparent positive electrode layer, an organic luminescence layer and a negative electrode layer are stacked on a transparent substrate (see, e.g., Japanese Patent Application Publication No. 2007-227523). The positive electrode layer and the negative electrode layer are connected to a power supply circuit unit which supplies a driving voltage to the light emitting panel. The negative electrode layer is grounded.

However, in the above-mentioned illumination apparatus, in a case where a common mode noise voltage may be superposed on an AC power, for example, a pulse current created by such a noise voltage may propagate into the light emitting panel, thereby causing instability in the operation of the light emitting panel.

SUMMARY OF THE INVENTION

In view of the above, the present invention provides an organic EL illumination module including an organic EL element as a light source, capable of stabilizing an operation of a light-emitting panel even when a noise voltage is superposed, for example.

In accordance with an aspect of the present invention, there is provided an organic EL module including a flat plate-like light emitting panel configured to use an organic EL element; and a holding member configured to hold the light emitting panel, wherein the holding member includes: a conductive member serving as at least a part of the holding member, and a capacitance component is provided between the conductive member and an electrode layer which is provided in the light emitting panel and to which a driving voltage is supplied.

The capacitance component may be formed by the electrode layer and a capacitance electrode provided on the power feeding electrode through an insulating layer and coupled to the conductive member of the holding member.

A chip capacitor may serve as the capacitance component, and the chip capacitor is provided on the light emitting panel or the holding member.

The electrode layer may include a positive electrode layer and a negative electrode layer, a parasitic capacitance may be generated between the positive electrode layer and the negative electrode layer, and an electrostatic capacitance of the capacitance component may be larger than the parasitic capacitance.

The conductive member of the holding member may be grounded.

The holding member may further include a connection connector configured to connect the power feeding electrode of the light emitting panel to a power supply circuit for supplying a power to the light emitting panel, and the conductive member of the holding member may be grounded at a side of the power supply circuit by being coupled to the connection connector.

In accordance with another aspect of the present invention, there is provided an illumination apparatus including the organic EL illumination module; and a power supply circuit configured to supply a driving voltage to the light emitting panel included in the organic EL illumination module.

In accordance with the aspects of the present invention, even when a common-mode noise voltage is superposed on an AC power, for example, a pulse current caused by such a noise voltage is absorbed by the action of the capacitance component, and therefore, a circuit operation of the light emitting panel is stabilized.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
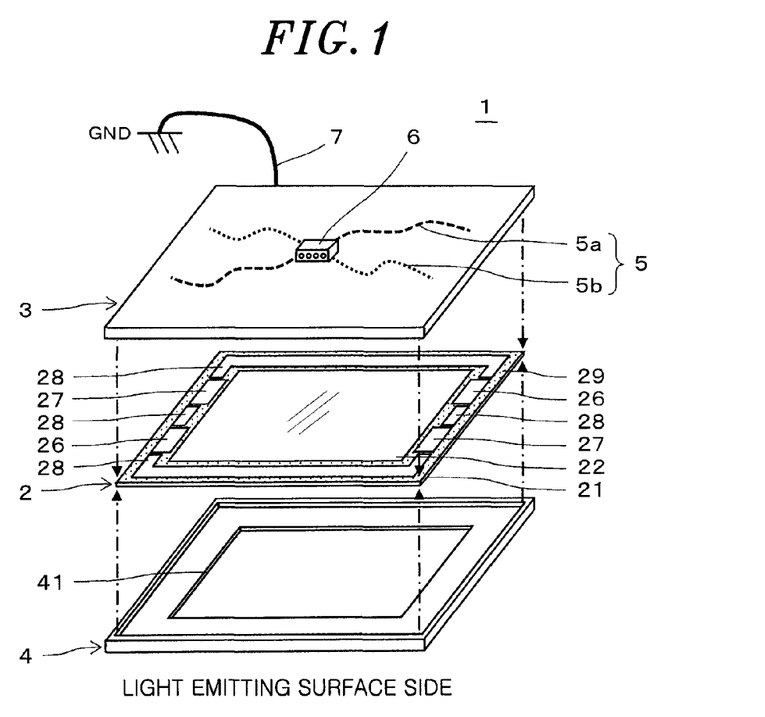
FIG. 1 is an exploded perspective view showing an organic EL illumination module in accordance with a first embodiment of the present invention.
Figure 2:
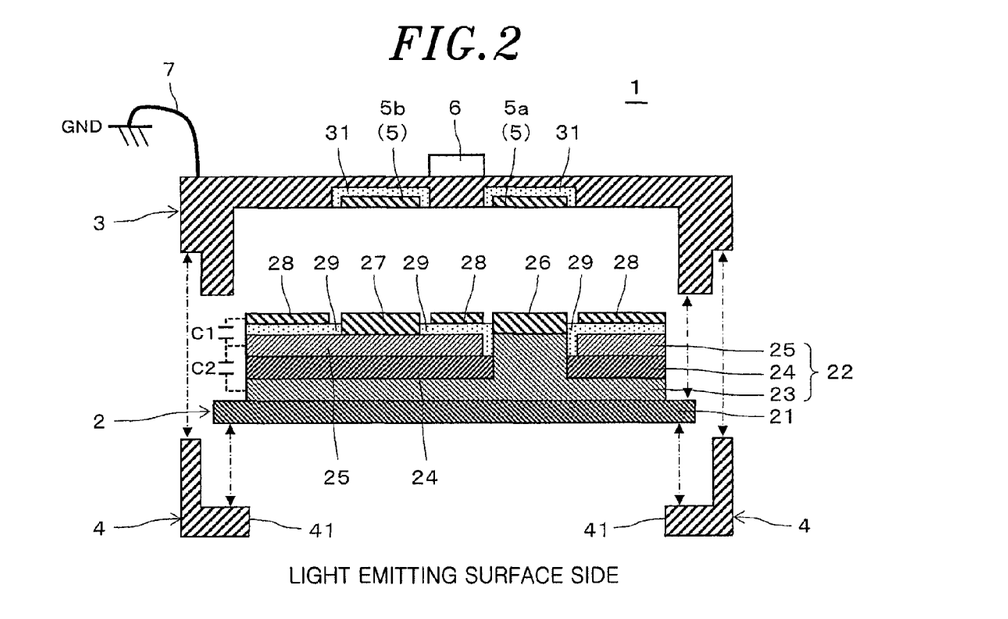
FIG. 2 is an exploded cross sectional view schematically showing the organic EL illumination module.
Figure 3:
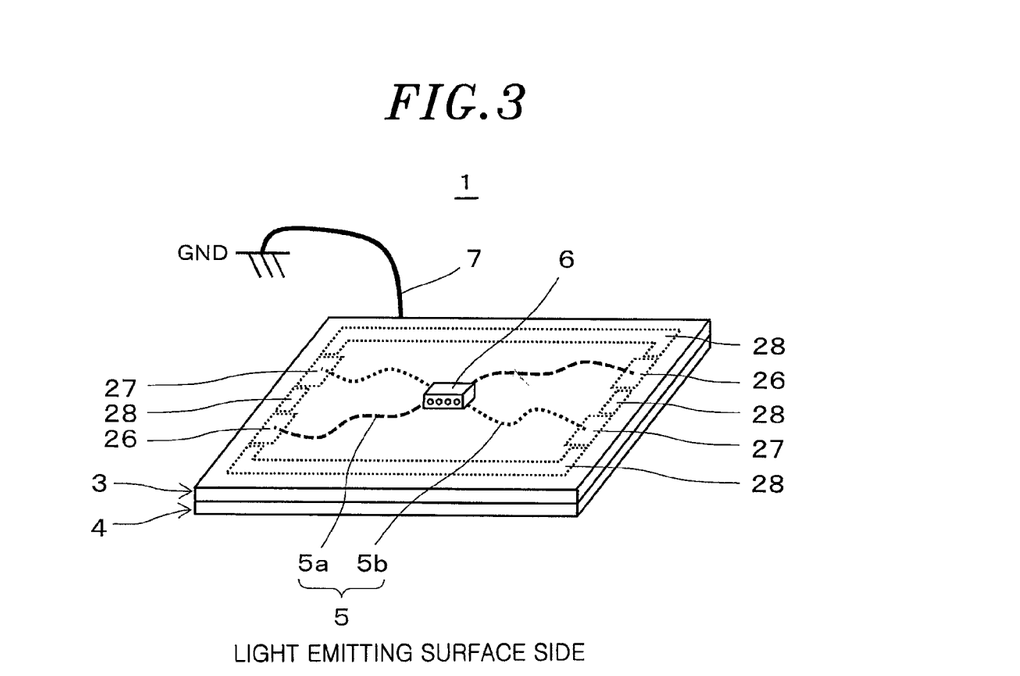
FIG. 3 is perspective view showing the organic EL illumination module.

Embodiments of the present invention will now be described with reference to FIGS. 1 to 6 which form a part hereof. Here, FIG. 1 is an exploded perspective view showing an illumination module 1, and FIG. 2 is a cross sectional view showing the illumination module 1 shown in FIG. 1. FIG. 3 is a perspective view showing the assembled illumination module 1, and FIG. 4 is a cross sectional view showing the illumination module 1 shown in FIG. 3.

Figure 4:
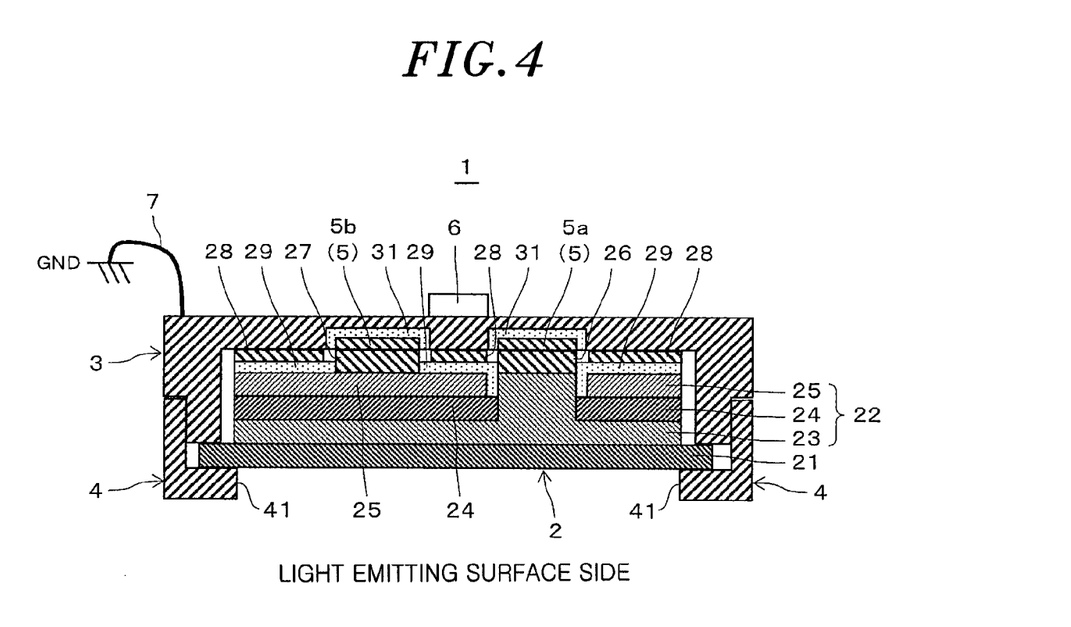
FIG. 4 is a cross sectional view schematically showing the organic EL illumination module.
Figure 5:
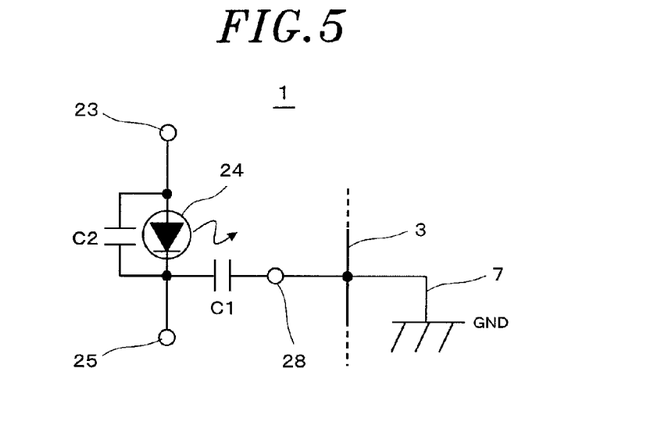
FIG. 5 is a circuit view showing the organic EL illumination module.
Figure 6:
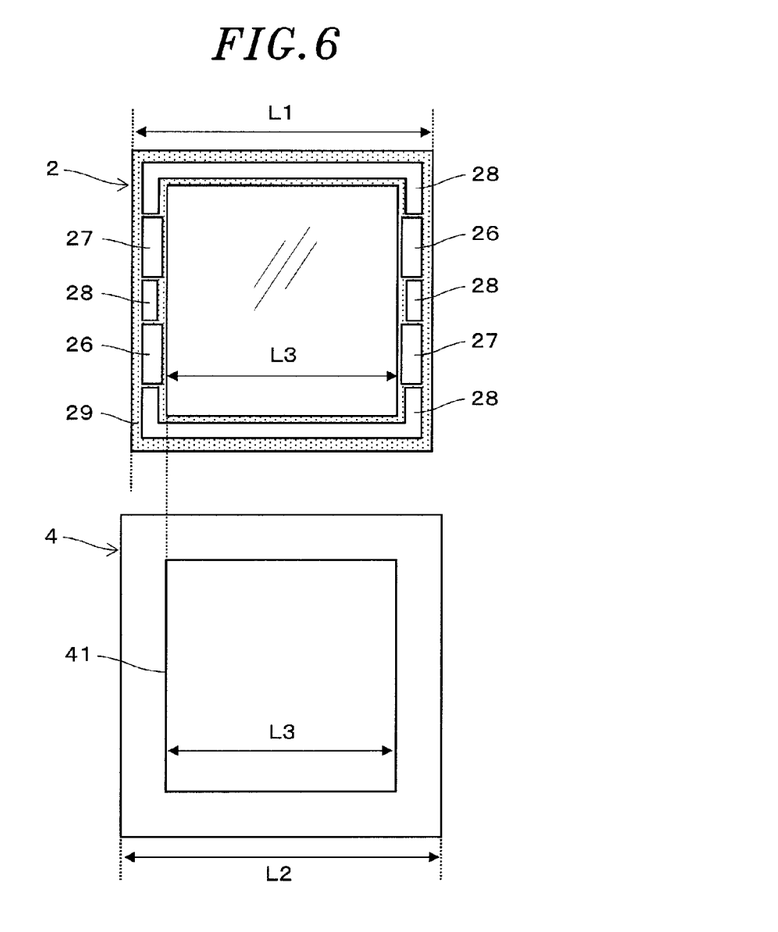
FIG. 6 is a plan view showing a light-emitting panel and a holding member, respectively, included in the organic EL illumination module.

Further, FIGS. 2 and 4 are respectively schematic views showing a configuration of the illumination module 1, which does not exactly correspond to a sectional configuration of the illumination module 1 shown in FIGS. 1 and 3. FIG. 5 is a circuit view showing the illumination module 1, and FIG. 6 showing dimensions of members included in the illumination module 1.

As shown in FIGS. 1 to 4, the illumination module 1 includes a flat plate-like light emitting panel 2; a first holding member 3 for holding the light emitting panel 2 at a side of a non-light emitting surface of the light-emitting panel 2; and a second holding member 4 for holding the light emitting panel 2 at a side of a light emitting surface of the light emitting panel 2. The light emitting panel 2 is connected to a connection connector 6 through distribution lines 5 embodied in the first holding member 3. The connection connector 6 serves to connect the light emitting panel 2 to a power supply circuit (not shown) for supplying a driving voltage to the light emitting panel 2. The connection connector 6 is disposed on a surface of the first holding member 3 opposite to the light emitting panel 2. The first holding member 3 is grounded through a ground line 7. The ground line 7 is fixed to the first holding member 3 by soldering, screwing or the like.

The light emitting panel 2 includes a square flat plate-like light-transmitting substrate 21; and a light emitting unit 22 provided on the light-transmitting substrate 21. The light emitting unit 22 is disposed at a central portion of the light-transmitting substrate 21. The light emitting unit 22 uses an organic EL element as a light source and includes a positive electrode layer 23 formed of a transparent conductive film; a light emitting layer 24 containing a light emitting organic material; and a light reflective negative electrode layer 25, which are stacked in that order on the light-transmitting substrate 21 (see FIGS. 2 and 4).

A part of the positive electrode layer 23 extends beyond the light emitting layer 24 outwardly, and an extended portion of the positive electrode layer 23 is connected to a positive power feeding electrode 26. A part of the negative electrode layer 25 extends beyond the light emitting layer 24 outwardly directly or via a conductive layer, and an extended portion of the negative electrode layer 25 is connected to a negative power feeding electrode 27. Provided at the periphery of the light emitting unit 22 are the positive power feeding electrode 26, the negative power feeding electrode 27, and a capacitance electrode 28 disposed between the positive and the negative power feeding electrode 26 and 27 to generate a capacitance component.

A driving voltage is supplied to the electrode layers 23 and 25 of the light emitting unit 22 through the power feeding electrodes 26 and 27. The capacitance electrode 28 is connected to the negative electrode layer 25 via an insulating layer 29. The insulating layer 29 is made of a material (e.g., barium titanate or a polyimide film) having a high dielectric constant and good durability. The top surfaces of power feeding electrodes 26 and 27 and the capacitance electrode 28 are arranged flush with each other.

The first holding member 3 is made of a metal (e.g., aluminum, aluminum alloy or copper alloy) having good electric and thermal conductivity and stiffness to serve as a conductive member. The first holding member 3 is of a box shape having one open side. The light emitting unit 22 is accommodated in the first holding member 3 in a state where the periphery of the open side is brought into contact with the light-transmitting substrate 21 of the light emitting panel 2.

The first holding member 3 has a height such that the inside thereof is brought into contact with upper surfaces of the power feeding electrodes 26 and 27 and the capacitance electrode 28.

The capacitance electrode 28 coupled to the first holding member 3 is disposed opposite to the negative electrode layer 25 of the light emitting unit 22 via the insulating layer 29. With this configuration, the insulating layer 29 (dielectric material) is disposed between the capacitance electrode 28 and the negative electrode layer 25, and thus a substantial capacitance component C1 is generated by the negative electrode layer 25, the capacitance electrode 28 and the insulating layer 29.

In terms of a circuit view shown in FIG. 5, the capacitance component C1 is connected to the negative electrode layer 25 of the light emitting layer 24. The capacitance component C1 is also grounded via the first holding member 3 and the ground line 7. Further, a material having a dielectric substance is partially contained in the light emitting layer 24, and thus a parasitic capacitance C2 is naturally generated between the positive electrode layer 23 and the negative electrode layer 25.

An electrostatic capacitance of the capacitance component C1 is larger than the parasitic capacitance C2. The electrostatic capacitance of the capacitance component C1 can be arbitrarily set by adjusting a surface area of the capacitance electrode 28, a distance between the capacitance electrode 28 and the negative electrode layer 25, and/or a dielectric constant of the material of the insulating layer 29. For example, to increase the electrostatic capacitance of the capacitance component C1, the surface area of the capacitance electrode 28 may be increased or the thickness of the insulating layer 29 may be reduced. Alternatively, the insulating layer 29 may be formed by using a material having a higher dielectric constant.

The first holding member 3 includes a distribution line 5a, which is electrically connected to the power feeding electrode 26, at a side thereof opposite to the power feeding electrode 26 of the light emitting panel 2. The distribution line 5a is coated with an insulating layer 31 to be insulated from the first holding member 3. Further, the first holding member 3 includes a distribution line 5b, which is electrically connected to the power feeding electrode 27, at a side thereof opposite to the supply power electrode 27. The distribution line 5b is coated with the insulating layer 31 to be insulated from the first holding member 3.

The second holding member 4 is made of the same material as that of the first holding member 3. The second holding member 4 is of a quadrangular tray-like shape with a quadrangular opening at the center thereof. The light emitting surface of the light-transmitting substrate 21 is held by a bottom portion of the second holding member 4. In other words, the light-transmitting substrate 21 is sandwiched by the first and the second holding member 3 and 4. By soldering, the light emitting panel 2 is coupled to the first and the holding member 3 and 4.

As shown in FIG. 6, in the organic EL element, the power feeding electrodes 26 and 27 are respectively arranged at opposite sides of the light emitting panel 2. Accordingly, large spaces exist along the other sides of the light emitting panel 2. Further, there is a space between the power feeding electrodes 26 and 27 on each of the sides of the light emitting panel 2 where the power feeding electrodes 26 and 27 are arranged.

The capacitance electrode 28 is formed in each of the spaces by patterning similarly to the power feeding electrodes 26 and 27. The shape and dimension of the capacitance electrode 28 can be adequately adjusted.

Accordingly, the electrostatic capacitance of the capacitance component C1 can be set arbitrarily. Further, the dimension of the capacitance electrode 28 can be set to a predetermined ratio of the dimension of the light emitting panel 2. For example, in the case that the light emitting panel 2 is formed two times larger than the original dimension thereof, the parasitic capacitance C2 becomes substantially two times larger. Accordingly, the capacitance electrode 28 is formed two times larger to make the capacitance component C1 substantially two times larger.

When a side of the light emitting panel 2 is set to a length L1 and an outer side of the second holding member 4 is set to a length L2, the length L1 is shorter than the length L2 in order that the light emitting panel 2 is entirely accommodated in the second holding member 4. Further, the length L1 is longer than a length L3 of a side of the opening 41 of the second holding member 4 in order to interpose the light emitting panel 2 between the first and the second holding member 3 and 4. Accordingly, at a peripheral portion of the light emitting panel 2, there exists a non-light emitting region (shown by dots) that is masked with the second holding member 4 and is not contributed to the light emission. The power feeding electrodes 26 and 27 and the capacitance electrode 28 are arranged at the non-light emitting region.

In accordance with the illumination module 1 of the present embodiment, the capacitance component C1 is connected between the first holding member 3 and the negative electrode layer 25 of the light emitting panel 2. Accordingly, even when a common mode noise voltage is superposed on an AC power, for example, a pulse current caused by such a noise voltage is absorbed by the action of the capacitance component C1. Therefore, a circuit operation of the light emitting panel 2 is stabilized. Further, since the first holding member 3 is grounded, the circuit operation of the light emitting panel 2 becomes more stable due to the stable voltage to ground.

Further, the electrostatic capacitance of the capacitance component C1 becomes larger than the parasitic capacitance C2, and thus the capacitance component C1 has lower impedance. Accordingly, even though a large pulse-like current is generated by a noise voltage, it is possible to prevent the light emitting panel 2 from being damaged by allowing such a large current to bypass the light emitting panel 2 through the capacitance component C1.

In addition, the dimension ratio between the capacitance electrode 28 and the light emitting panel 2 is maintained at a constant value. Accordingly, when the dimension of the light emitting panel 2 is changed, the dimension of the capacitance electrode 28 is also changed. As a result, the electrostatic capacitance of the capacitance component C1 is changed. Therefore, even though the dimension of the light emitting panel 2 is changed, the electrostatic capacitance of the capacitance component C1 can be constantly maintained at an adequate value. Further, when the dimension of the light emitting panel 2 is changed, it is possible to maintain the electrostatic capacitance of the capacitance component C1 at a certain value by keeping the dimension of the capacitance electrode 28 unchanged.

Additionally, since the capacitance component C1 is provided by using the negative electrode 25 of the light emitting panel 2, it is possible to generate the capacitance component C1 while suppressing an increase in the number of members to a minimum. The capacitance electrode 28 is also provided at the non-light emitting region, so that the capacitance component C1 can be provided without decreasing the area of the light emitting surface of the light emitting panel 2. Further, since the region where the capacitance component C1 is provided is not seen from the outside of the illumination module 1, the appearance of the illumination module 1 is not deteriorated by the presence of the capacitance component C1.

Furthermore, the first and the second holding member 3 and 4 are made of a metal having a strong rigidity, and thus the rigidity of the entire part of the illumination module 1 is increased. This makes it possible to scale up the illumination module 1. In addition, since the first and the second holding member 3 and 4 are made of a metal having a high thermal conductivity, it is possible to effectively dissipate heat to the outside and prevent a thermal deformation of the light emitting panel 2.

Next, an illumination module 100 in accordance with a second embodiment of the present invention will be described with reference to FIGS. 7 to 10. In the second embodiment, components having substantially the same configuration and function as those of the first embodiment are denoted by like reference characters, and thus redundant description thereof will be omitted herein.

Figure 7:
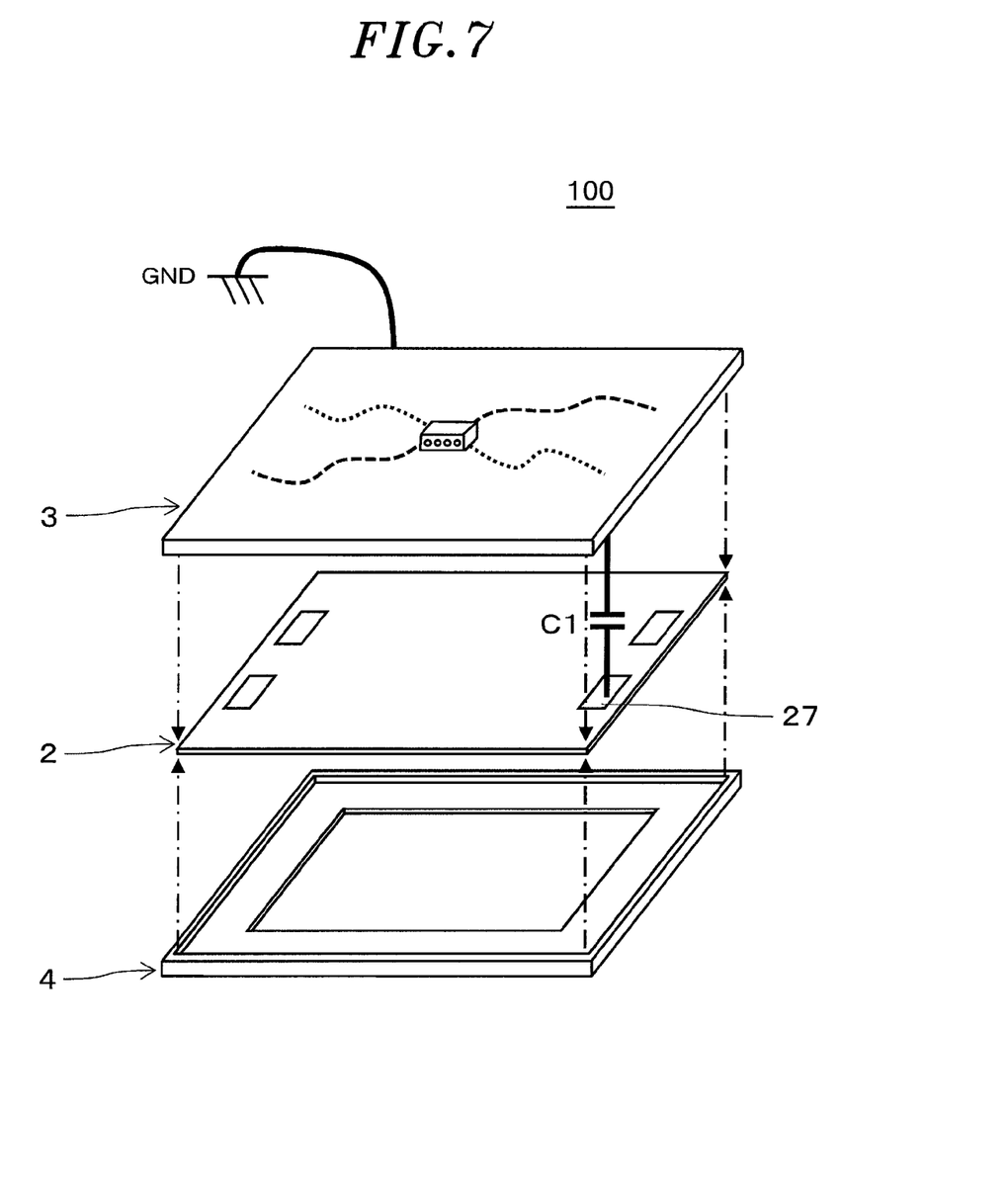
FIG. 7 is an exploded perspective view schematically showing an organic EL illumination module in accordance with a second embodiment of the present invention.

As shown in FIG. 7, the illumination module 100 has the capacitance component C1 between the first holding member 3 and the power feeding electrode 27 (negative electrode 25) of the light emitting panel 2. In the illumination modules 100 and 100' respectively shown in FIGS. 8 and 9, a chip capacitor 8 serves as the capacitance component C1.

Figure 8:
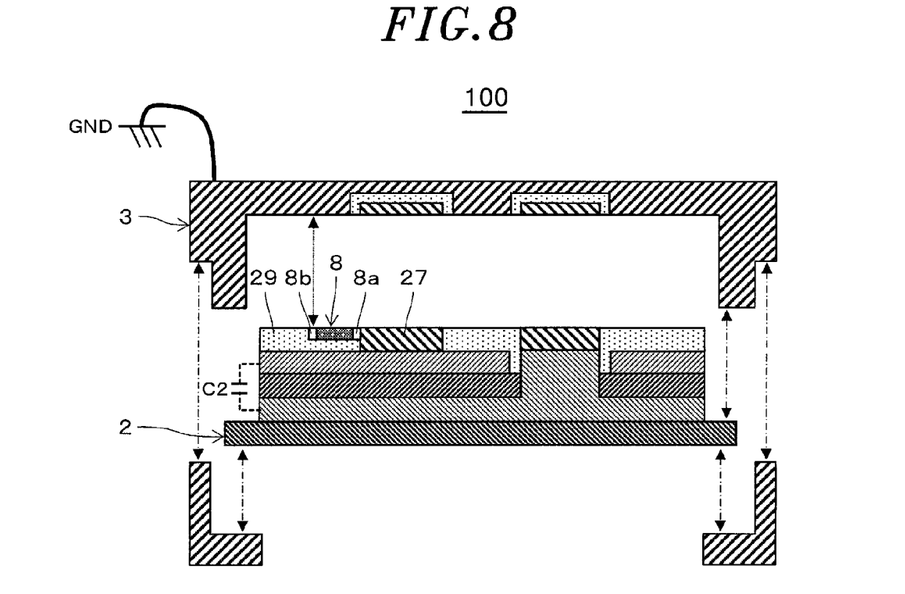
FIG. 8 is an exploded perspective view showing the organic EL illumination module.

In FIG. 8, the chip capacitor 8 is provided on the light emitting panel 2, and electrodes 8a and 8b are respectively provided at opposite ends of the chip capacitor 8. The electrode 8a is coupled to the power feeding electrode 27 by soldering, and the electrode 8b is buried in the insulating layer 29 while being coupled to the first holding member 3 by soldering.

Figure 9:
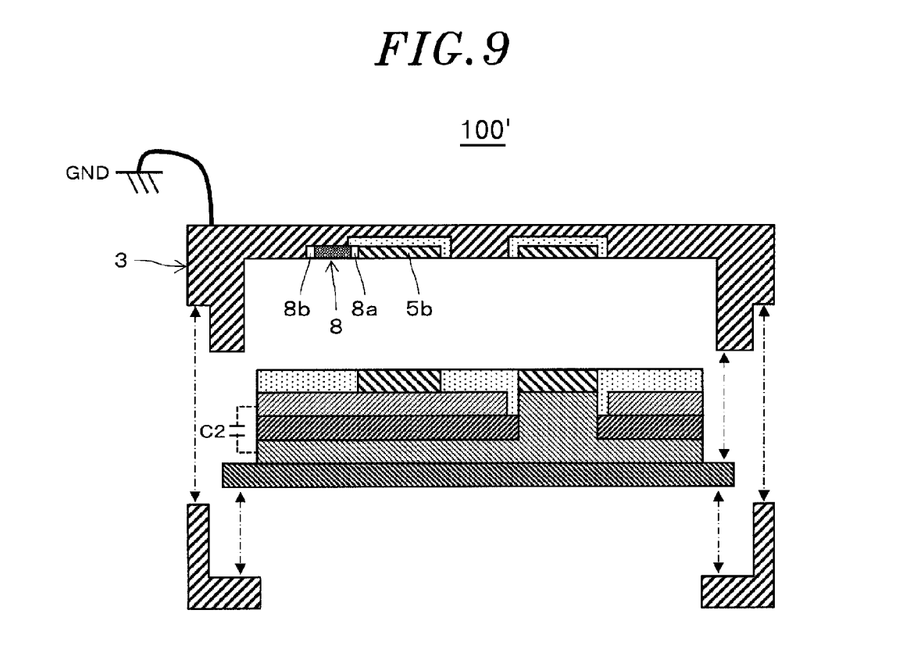
FIG. 9 is an exploded perspective view showing an organic EL illumination module in accordance with a modification of the second embodiment.
Figure 10:
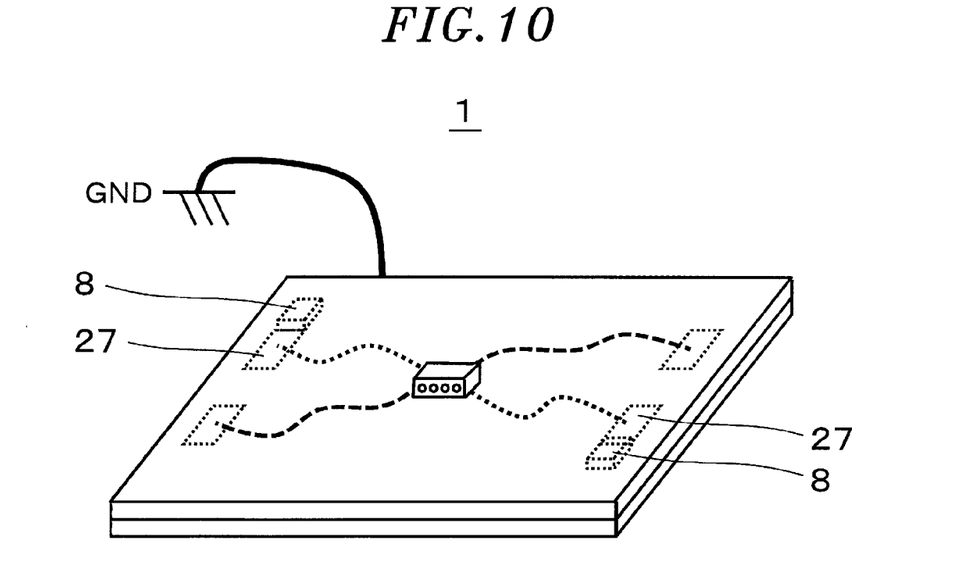
FIG. 10 is a perspective view showing an exploded perspective view showing the organic EL illumination module.

In the illumination module 100' in accordance with a modification of the second embodiment as shown in FIG. 9, the chip capacitor 8 is provided on the first holding member 3. The electrode 8a is coupled to the distribution line 5b by soldering, and the electrode 8b is buried in the first holding member 3 while being coupled to the first holding member 3 by soldering. Alternatively, chip capacitors 8 may be provided in the single illumination module 1 as shown in FIG. 10.

In accordance with the second embodiment and the modification thereof, the chip capacitor 8 serves as the capacitance component C1, so that the electrostatic capacitance of the capacitance component C1 can be accurately set. Further, since the chip capacitor 8 is provided on the first holding member 3 in the illumination module 100' shown in FIG. 9, the number of processes for manufacturing the light emitting panel 2 can be decreased, thereby reducing effects of dusts, excessive external forces and the like which may be applied to the light emitting panel 2. In addition, by mounting the multiple chip capacitors 8 in the single illumination module 100, the loads of the respective chip capacitors 8 can be reduced to lower such stresses. Additionally, by using the multiple chip capacitors 8, it is possible to scale down the respective chip capacitors 8 as compared with the case of using one chip capacitor 8. Here, the chip capacitors 8 may have a same kind of chip capacitors or various kinds of chip capacitors depending on frequency bands desired to be reduced.

Figure 11:
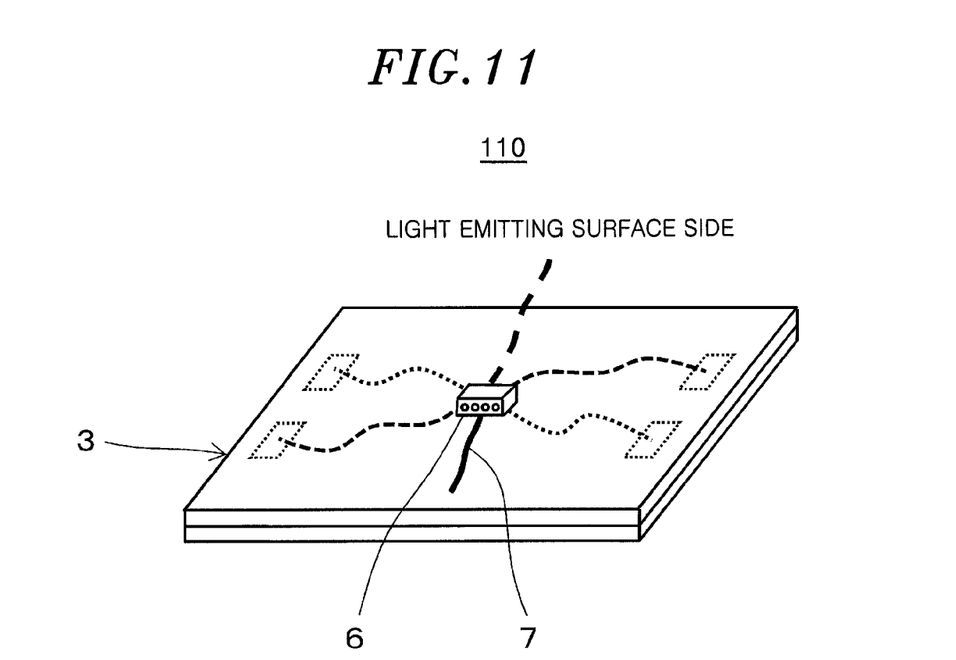
FIG. 11 is an exploded perspective view showing an organic EL illumination module in accordance with a third embodiment of the present invention.

Next, an illumination module 110 in accordance with a third embodiment of the present invention will be described with FIG. 11. In the third embodiment, components having substantially the same configuration and function as those of the first embodiment are denoted by like reference characters, and thus redundant description thereof will be omitted herein. In the present embodiment, the first holding member 3 is connected to the connection connector 6 through the ground line 7 to be grounded at the side of a power supply circuit.

Accordingly, since the ground line 7 is not drawn from the first holding member 3 as in the illumination module 1 shown in FIG. 3, it is possible to improve the appearance of the illumination module 110. Further, by using two or more pins for the connection to the connection connector 6 of the ground line 7, it is possible to substantially thicken the ground line 7.

Figure 12A:
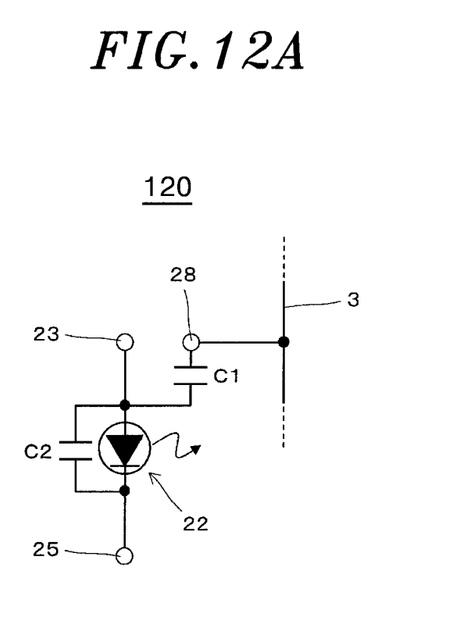
FIGS. 12A and 12B are circuit views showing the organic EL illumination module in accordance with the third embodiment and a modification thereof, respectively.
Figure 12B:
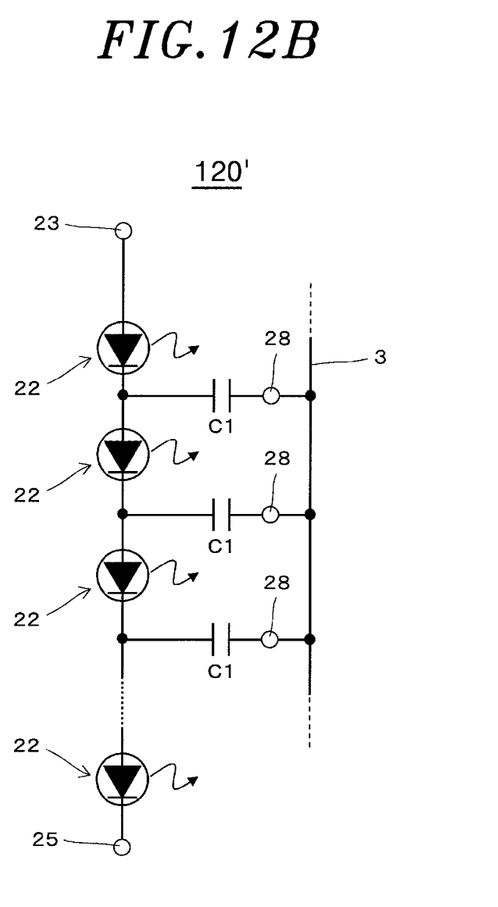

Next, illumination module 120 and 120' in accordance with other embodiments of the present invention will be described with FIGS. 12A and 12B. In the illumination module 120 shown in FIG. 12A, the capacitance component C1 is connected to the positive electrode 23 of the single light emitting unit 22. In the illumination module 120' shown in FIG. 12B, multiple light emitting units 22 are provided in parallel, and capacitance components C1 are respectively connected to negative electrode layers 25 of the light emitting units. As such, the capacitance component(s) C1 may be provided at adequate portion(s) depending on circuit configurations of the illumination modules.

Figure 13:
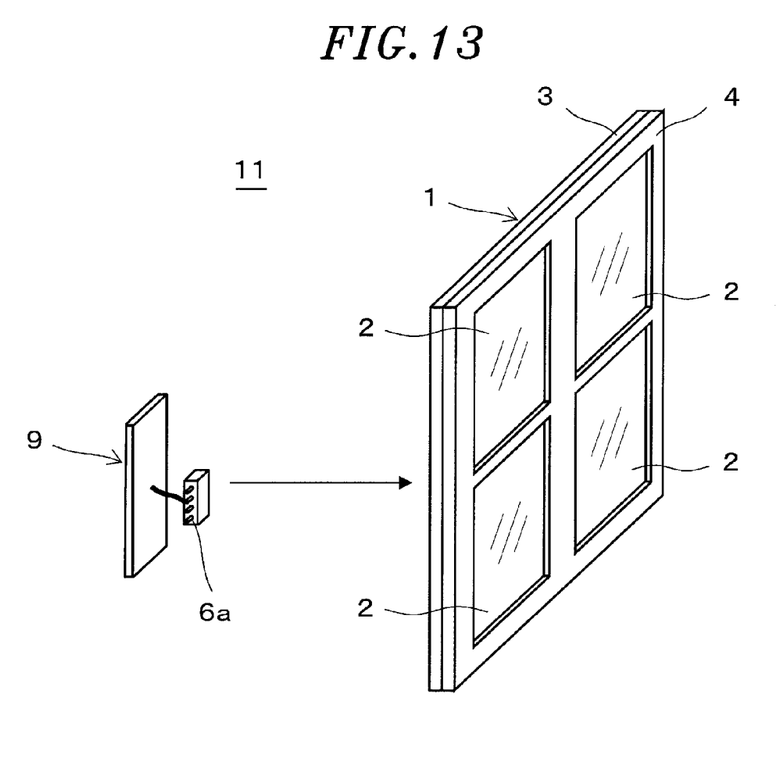
FIG. 13 is an exploded perspective view showing an illumination apparatus including the organic EL illumination module of the embodiments.
Figure 14:
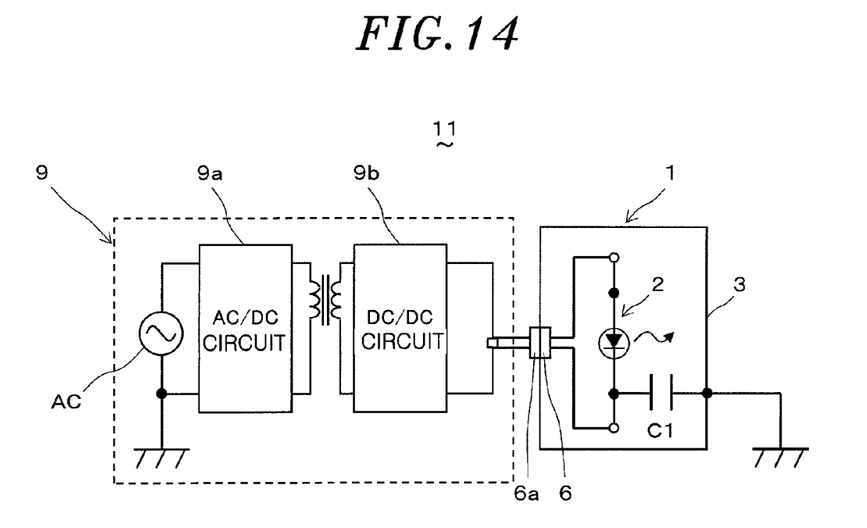
FIG. 14 is a circuit view showing the illumination apparatus.

Next, an illumination apparatus 11 including, e.g., the aforementioned illumination module 1 will be described with reference to FIGS. 13 and 14. The illumination apparatus 11 includes four light emitting panels 2 which are arranged in a matrix form of 2×2; a first and a second holding member 3 and 4 which hold the light emitting panels collectively; and a power supply circuit 9. The power supply circuit 9 is of a rectangular flat plate-like shape and includes a connection connector 6a for the connection to the connection connector 6. The power supply circuit 9 is electrically connected to the illumination module 1 by connecting the connection connectors 6 and 6a to each other. The power supply circuit 9 is disposed at the opposite surface of the first holding member 3 to the surface thereof facing the light emitting panel 2.

As shown in FIG. 4, the power supply circuit 9 includes an AC/DC circuit 9a for converting an AC current supplied from a commercial AC power supply AC to a DC current; and a DC/DC circuit 9b insulated from the AC/AC circuit 9a. Each of the AC/DC circuit 9a and the DC/DC circuit 9b is scaled down to perform voltage conversion by turning on and off a switching element with a high frequency. The power supply circuit 9 supplies to the illumination module 1 a steady voltage serving as a driving voltage in order to entirely turn on the illumination module 1. In order to perform dimming of the illumination module 1, the power supply circuit 9 supplies a pulse-like voltage generated by the PWM control or the like as the driving voltage to the illumination module 1. The power supply circuit 9 is grounded at the AC/CD circuit 9a, and the illumination module 1 is grounded via the first holding member 3. In accordance with the illumination apparatus 11, it is possible to provide an illumination apparatus whose circuit operation is stabilized by using the capacitance component C1. Further, noises caused by such high frequency switching can be reduced by the action of the capacitance component C1.

The organic EL illumination module and the illumination apparatus including same in accordance with the present invention is not limited to the above embodiments and the modifications thereof, but various modified embodiments are possible. For example, it is not necessary that the electrostatic capacitance of the capacitance component provided in the light emitting panel be larger than the parasitic capacitance of the light emitting panel. The electrostatic capacitance of the capacitance component provided in the light emitting panel may be smaller than that of the parasitic capacitance of the light emitting panel.

Further, the organic EL illumination module may be in a floating state with respect to the ground without grounding the first holding member. In this case, it is possible to stabilize the organic EL illumination module by equalizing potentials of the light emitting panel and the first holding member via the capacitance component.

In addition, the entire part of the first holding member is not required to serve as a conductive member. Alternatively, as long as the capacitance component and parts which are brought into contact with the ground line serve as conductive members, the other parts may be made of a non-conductive material such as a resin or the like. Furthermore, the entire part of the second holding member may be made of a non-conductive material such as a resin or the like. The first and the second holding member may be entirely covered with a non-conductive resin. In this way, it is possible to reduce the possibility that a user is electrocuted due to his/her careless contact with the conductive member.

In the above embodiments, the positive electrode layer 23, the light emitting layer 24 and the negative electrode layer 25 are successively stacked on the substrate 21. Alternatively, the negative electrode layer 25, the light emitting layer 24 and the positive electrode layer 23 may be successively stacked on the substrate 21. In this case, the capacitance component C1 is connected between the positive electrode layer 23 and the first holding member 3.

While the invention has been shown and described with respect to the embodiments, it will be understood by those skilled in the art that various changes and modifications may be made without departing from the scope of the invention as defined in the following claims.

What is claimed is:

1. An organic EL illumination module comprising:
   a flat plate-like light emitting panel configured to use an organic EL element, the light emitting panel including a positive electrode layer, a light emitting layer containing a light emitting organic material, and a negative electrode layer, which are stacked in that order; and
   a holding member configured to hold the light emitting panel,
   wherein the holding member includes: a conductive member serving as at least a part of the holding member,
   wherein the light emitting panel further includes an insulating layer and a capacitance electrode which is connected to one of the positive electrode layer and the negative electrode layer via the insulating layer and is coupled to the conductive member,
   wherein a capacitance component is provided between the conductive member and said one of the positive electrode layer and the negative electrode layer.

2. The organic EL illumination module of claim 1, wherein
   a parasitic capacitance is generated between the positive electrode layer and the negative electrode layer, and
   an electrostatic capacitance of the capacitance component is larger than the parasitic capacitance.

3. The organic EL illumination module of claim 1, wherein the conductive member of the holding member is grounded.

4. The organic EL illumination module of claim 1, wherein the holding member further includes: a connection connector configured to connect the positive electrode layer and the negative electrode layer of the light emitting panel to a power supply circuit for supplying a power to the light emitting panel, and
   the conductive member of the holding member is grounded at a side of the power supply circuit by being coupled to the connection connector.

5. An illumination apparatus comprising:
   the organic EL illumination module of claim 1; and
   a power supply circuit configured to supply a driving voltage to the light emitting panel included in the organic EL illumination module.

* * * * *